US012683588B2

(12) United States Patent
Jones

(10) Patent No.: US 12,683,588 B2
(45) Date of Patent: Jul. 14, 2026

(54) CROSS-COUPLED LATCH CHARGE PUMP AS WELL AS A METHOD OF OPERATING SUCH A CROSS-COUPLED LATCH CHARGE PUMP

(71) Applicant: NEXPERIA B.V, Nijmegen (NL)

(72) Inventor: Mark Jones, Kernersville, NC (US)

(73) Assignee: Nexperia B.V., Nijmegen (NL)

(*) Notice: Subject to any disclaimer, the term of this patent is extended or adjusted under 35 U.S.C. 154(b) by 0 days.

(21) Appl. No.: 18/679,876

(22) Filed: May 31, 2024

(65) Prior Publication Data

US 2025/0373234 A1     Dec. 4, 2025

(51) Int. Cl.
*H03K 3/3562* (2006.01)
*H03K 3/012* (2006.01)
*H03K 19/0185* (2006.01)

(52) U.S. Cl.
CPC ........... *H03K 3/3562* (2013.01); *H03K 3/012* (2013.01); *H03K 19/018521* (2013.01)

(58) Field of Classification Search
CPC ................. H03K 3/3562; H03K 3/012; H03K 19/018521
USPC .......................................... 327/202
See application file for complete search history.

(56) References Cited

U.S. PATENT DOCUMENTS

| | | | | | |
|---|---|---|---|---|---|
| 8,049,553 | B2* | 11/2011 | Kim | ........................ | G11C 5/145 |
| | | | | | 363/60 |
| 8,476,963 | B2* | 7/2013 | Cook | ..................... | H02M 3/07 |
| | | | | | 363/60 |
| 9,013,229 | B2* | 4/2015 | Rahman | ................ | H02M 3/073 |
| | | | | | 327/536 |
| 9,219,427 | B2* | 12/2015 | Aebischer | .............. | H02H 9/046 |
| 9,369,115 | B2* | 6/2016 | Kalluru | .................. | G11C 16/08 |
| 11,569,738 | B1* | 1/2023 | Chinthu | .................. | H02M 3/07 |
| 12,040,705 | B2* | 7/2024 | Heubi | ................... | H02M 3/073 |
| 12,348,133 | B2* | 7/2025 | Chinthu | ............... | H02M 3/073 |
| 2007/0053227 | A1* | 3/2007 | Ragone | .............. | H03K 17/6874 |
| | | | | | 365/189.09 |
| 2012/0049936 | A1* | 3/2012 | Adkins | .................... | H02M 3/07 |
| | | | | | 327/536 |
| 2012/0139622 | A1* | 6/2012 | Ryu | ......................... | G11C 5/14 |
| | | | | | 327/536 |
| 2012/0169404 | A1* | 7/2012 | Cook | ...................... | H02M 3/07 |
| | | | | | 327/536 |
| 2014/0097887 | A1* | 4/2014 | Aebischer | ................. | G05F 3/02 |
| | | | | | 327/536 |

(Continued)

*Primary Examiner* — Ryan Jager
(74) *Attorney, Agent, or Firm* — Ruggiero McAllister & McMahon LLC

(57) ABSTRACT

A cross-coupled latch charge pump is provided, including a first inverter, a second inverter, and an output of the first inverter is connected to an input of the second inverter and an output of the second inverter is connected to an input of the first inverter. The first supply terminals of both the first and second inverter are connected to an output capacitor and second supply terminals for both the first and second inverter are connected to a reference voltage, a first fly capacitor, a second fly capacitor, and a first plate of the second fly capacitor is arranged for receiving a second clock signal, and a second plate of the second fly capacitor is connected to the input of the second inverter. The cross-coupled latch charge pump includes a transistor connected between the reference voltage and the second supply terminals.

17 Claims, 4 Drawing Sheets

(56) References Cited

U.S. PATENT DOCUMENTS

2014/0103415 A1*  4/2014  Aebischer ............ H10D 84/038
                                                257/299
2014/0104903 A1*  4/2014  Aebischer ............. H02M 7/125
                                                363/56.12
2015/0188418 A1*  7/2015  Huh ...................... H02M 3/073
                                                327/536

* cited by examiner

Non Overlapping Drive

Tri State Drive

CROSS-COUPLED LATCH CHARGE PUMP AS WELL AS A METHOD OF OPERATING SUCH A CROSS-COUPLED LATCH CHARGE PUMP

BACKGROUND

1. Field of the Disclosure

The present disclosure relates to the field of electronics, specifically decreasing power losses caused by, for example, energy loss associated with parasitic capacitance of integrated capacitors as well as from backward current flow during state transitions.

2. Description of the Related Art

A cross-coupled charge pump is typically a type of charge pump circuit commonly used in voltage doubler and voltage inverter applications. It consists of two sets of cross-coupled switches and capacitors.

When the clock signal switches, one set of switches connects the input voltage to one set of capacitors while the other set disconnects the capacitors from the output. As a result, the voltage across one set of capacitors increases, storing energy from the input voltage.

Then, when the clock signal switches again, the roles reverse. The second set of switches connects the charged capacitors in series with the input voltage, effectively doubling the voltage across the output. Meanwhile, the first set of switches disconnects the capacitors from the input and allows them to be recharged from the input voltage, preparing for the next cycle.

This operation allows the charge pump to effectively double the input voltage at the output, making it useful for applications where a higher voltage level is required. However, parasitic capacitance and other losses can impact the efficiency of the charge pump, requiring careful design considerations to optimize performance.

In charge pumps with on-chip capacitors, the integrated capacitors are used to store and transfer charge to generate the desired output voltage. However, these capacitors typically aren't ideal and have parasitic capacitance associated with them.

Parasitic capacitance refers to the capacitance that exists unintentionally between conductors or components in a circuit. In the case of on-chip capacitors, parasitic capacitance can arise due to various factors such as the layout of the capacitors, the proximity of conductive traces, and the characteristics of the semiconductor material.

When the charge pump operates, it transfers charge between the capacitors to generate the output voltage. However, some of the charge stored in the capacitors is lost due to the parasitic capacitance. This loss occurs because part of the charge that should contribute to the output voltage is instead coupled to the parasitic capacitance and is effectively wasted.

As a result, the efficiency of the charge pump decreases because not all of the stored charge can be effectively utilized to generate the desired output voltage. Minimizing parasitic capacitance and optimizing the design of on-chip capacitors are important considerations in the design of charge pumps to mitigate energy loss and improve efficiency.

Furthermore, during the operation of the cross-coupled charge pump, the cross-coupled configuration of the switches helps ensure stable and consistent voltage doubling. When the clock signal transitions, the switching action causes the output voltage to rise depending on the state of the capacitors and switches. This dynamic operation maintains the output voltage at a higher level compared to the input voltage However, during half-cycle state transitions, there can be a phenomenon called "backward current flow." This occurs when the inactive inverter allows current to flow from the output node back into the power supply or ground, depending on the specific configuration.

This backward current flow can result in losses within the charge pump circuit. The energy stored in the output capacitance of the charge pump can dissipate as heat due to this current flow, reducing the overall efficiency of the charge pump.

SUMMARY

It would be advantageous to achieve a cross-coupled latch charge pump that mitigates at least one of the drawbacks as set out in the background section. It would further be advantageous to achieve a corresponding method.

In a first aspect of the present disclosure, there is provided a cross-coupled latch charge pump, comprising:
a first inverter,
a second inverter, wherein an output of the first inverter is connected to an input of the second inverter and wherein an output of the second inverter is connected to an input of the first inverter, wherein first supply terminals of both said first and second inverter are connected to an output capacitor and second supply terminals for both said first and second inverter are connected to a reference voltage;
a first fly capacitor comprising a first and a second plate, wherein the first plate of the first fly capacitor is arranged for receiving a first clock signal, and wherein the second plate of the first fly capacitor is connected to the input of the first inverter;
a second fly capacitor comprising a first and a second plate, wherein the first plate of the second fly capacitor is arranged for receiving a second clock signal, and wherein the second plate of the second fly capacitor is connected to the input of the second inverter;
wherein the cross-coupled latch charge pump comprises a transistor connected between the reference voltage and said second supply terminals.

The inventors have found that it may be beneficial to place the latch, i.e. the cross-coupled inverters, into a high impedance state for a certain time period during state transitions.

This is beneficial as this high impedance will allow for the first fly capacitor and second fly capacitor to electrically float, enabling parasitic charge recycling between these capacitors. The high impedance state further prevents backward current flow.

This is accomplished by introducing the transistor connected between the reference voltage and the second supply terminals. The transistor is able to connect the reference voltage to the second supply terminals and to disconnect the reference voltage from the second supply terminals. In the latter, a high impedance state is obtained. This prevents reverse current flow.

During the operation of the charge pump, the inverters in the latch may switch states rapidly. When one inverter switches from driving high to driving low, and the other inverter switches from driving low to driving high, there may be a brief period where both inverters may conduct simultaneously, albeit for a very short duration dictated by the non-overlapping timing constraints.

If the non-overlapping timing signals are not perfectly synchronized or if there are delays in the signal propagation through the inverters, there could be a momentary period where both the top and bottom transistors of the latch are conducting simultaneously. This simultaneous conduction can create a short circuit path, allowing reverse current flow through the latch.

Reverse current flow in digital circuits can lead to various issues such as increased power consumption, degraded performance, and even device failure due to overstress on components or the like.

By placing the latch, i.e. the cross-coupled inverters, into a high impedance state for a certain time period during state transitions the reverse current flow is prevented to a certain extent. In another example, the output voltage over said output capacitor is provided to a gate terminal of said transistor.

In a further example, the charge pump further comprises a capacitance connected between the gate terminal of the transistor and a control signal, and further comprises an impedance connected between the gate terminal of the transistor and the output capacitor.

The RC network may be provided to impose the control signal on top of the output voltage. The capacitor allows for the AC coupling. It is noted that the control signal provided to the capacitor of the RC network may have a synchronized timing, such that the latch is provided in a high impedance state at the correct moments in time.

The above provided examples of the present application are directed to providing one transistor for achieving the high impedance state of the inverter. In a further example, the cross-coupled latch charge pump further comprises:

a further transistor connected between the output capacitor and the first supply terminals.

The further transistor may be used to disconnect the first supply terminals of the inverters, thereby ensuring a high impedance state of the cross-coupled latch charge pump.

In a further example, a gate terminal of the further transistor is connected to the reference voltage.

In yet another example, the charge pump further comprises a further capacitance connected between the gate terminal of the further transistor and yet a further control signal, and further comprises a further impedance connected between the gate terminal of the further transistor and the reference voltage.

As mentioned above, the RC network may be provided to impose the further control signal on top of the output voltage.

In yet another example, the charge pump further comprises:

a shunt switch connected between the first plate of the first fly capacitor and the first plate of the second fly capacitor.

The inventors have found that parasitic capacitances may be present, connected to the first and second fly capacitor, respectively.

As mentioned above, when the charge pump operates, it transfers charge between the fly capacitors to generate the output voltage. However, some of the charge stored in the capacitors is lost due to the parasitic capacitance. This loss occurs because part of the charge that should contribute to the output voltage is instead coupled to the parasitic capacitance and is effectively wasted.

As a result, the efficiency of the charge pump decreases because not all of the stored charge can be effectively utilized to generate the desired output voltage.

The inventors have found a solution by implementing the shunt switch such that the charge available in the parasitic capacitances can be transferred to one another. By closing the shunt switch the transfer of charge between the parasitic capacitances becomes possible. This reduces any losses occurring in the cross-coupled charge pump. More specifically, this may reduce 50% of the losses due to the lower voltage fly capacitor nodes as the shared voltage after the charge recycling is the supply voltage divided by two.

In a further example, a gate terminal of the shunt switch is connected to the control signal.

In yet another example, latch charge pump further comprises:

a non-overlapping drive clock arranged for providing non-overlapping drive signals to the first plate of the first fly capacitor and to the first plate of the second fly capacitor, respectively.

A non-overlapping clock signal refers to a type of clocking mechanism used to control the timing of operations within the cross-coupled latch charge pump.

A non-overlapping clock signal consists of two complementary clock signals. These signals are designed such that they never overlap-only one is high while the other is low at any given time. More specifically, a non-overlapping drive may be viewed as a drive wherein the N-type and P-type devices comprised by the driver are never on at the same time, and a small time period or "dead zone" may be created where one device turns OFF before the other turns ON.

This ensures that certain operations within the cross-coupled latch charge pump, such as the switching transistors or latches, occur only when the clock signals are in specific states, preventing any potential conflicts or short-circuits.

In the context of a cross-coupled latch charge pump, the non-overlapping clock signals may be of importance for synchronizing the charging and discharging of capacitors and controlling the state machine. This helps in generating stable and precise output frequencies or in maintaining a locked phase relationship between two signals.

In a further example, the latch charge pump further comprises:

a tri-state drive clock arranged for providing inverse drive signals, wherein a first of said drive signals is the control signal and a second of the drive signals is the yet the further control signal.

In a second aspect of the present disclosure, there is provided a method of operating a cross-coupled latch charge pump in accordance with any of the previous examples, wherein the method comprises the steps of:

temporarily placing, by the transistor, the first and second inverter into a high impedance state by receiving the further control signal on the gate terminal of the transistor.

It is noted that the advantages as explained with reference to the first aspect of the present disclosure being the cross-coupled latch charge pump, are also applicable to the second aspect of the present disclosure, being the method of operating such a cross-coupled latch charge pump.

In an example, the method further comprises the step of:

temporarily placing, by the further transistor, the first and second inverter into a high impedance state by receiving the yet the further control signal on the gate terminal of the further transistor.

In a further example, the method comprises the step of:

allowing, by the shunt switch, charge to flow between parasitic capacitance connected to the first plate of the first fly capacitor and the first plate of the second fly capacitor.

In another example, the method further comprises the step of:

receiving, by the gate terminal of the shunt switch, the control signal.

In yet another example, the shunt switch comprises a transistor.

The inventors have found that it may be beneficial to utilize cross-coupled inverters with at least one transistor in order to create a temporary high-impedance state in the electronic circuit. In addition, a shunt switch may be used for allowing charge to move between two nodes in the electronic circuit. The advantages of the above are that there is reduced backward current flow, and the efficiency of the cross-coupled latch charge pump is improved The high-impedance state of the cross-coupled latch inverters are obtained using switches, for example Metal Oxide Semiconductor Field Effect Transistors, MOSFETs. The gates of these switches may be controlled by at least one input voltage, depending on the example circuit.

When this high-impedance state is present in the system, backward current flow from the cross-coupled latch inverters is reduced and/or prevented, which also decreases losses and improves efficiency.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

The above and other aspects of the disclosure will be apparent from and elucidated with reference to the examples described hereinafter.

DETAILED DESCRIPTION

Figure 1C:
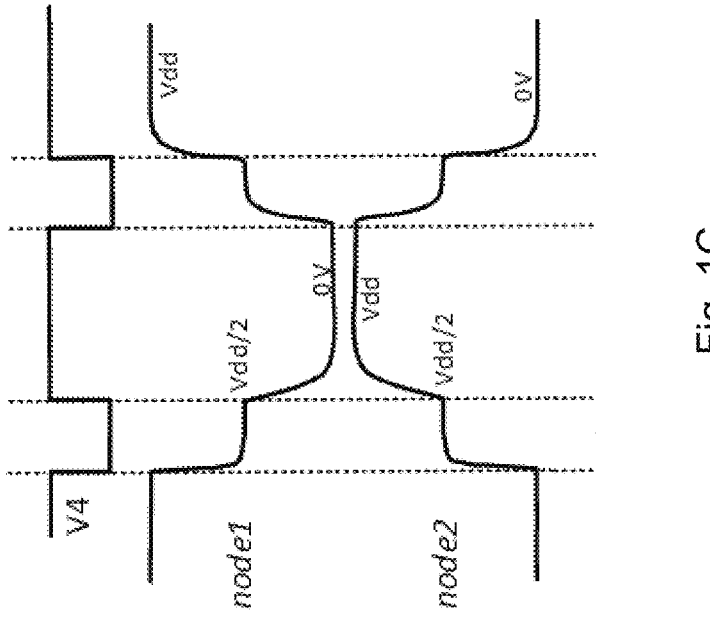
FIG. 1*c* discloses an example of voltages present at the parasitic capacitances.

It is noted that in the description of the figures, same reference numerals refer to the same of similar components performing a same of essentially similar function.

A more detailed description is made with reference to particular examples, some of which are illustrated in the appended drawings, such that the features of the present disclosure may be understood in more detail. It is noted that the drawings only illustrate typical examples and are therefore not to be considered to limit the scope of the subject matter of the claims. The drawings are incorporated for facilitating an understanding of the disclosure and are thus not necessarily drawn to scale. Advantages of the subject matter as claimed will become apparent to those skilled in the art upon reading the description in conjunction with the accompanying drawings.

The ensuing description above provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or" in reference to a list of two or more items, covers all the following interpretations of the word: any of the items in the list, all of the items in the list, and any combination of the items in the list.

These and other changes can be made to the technology considering the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein.

Figure 1A:
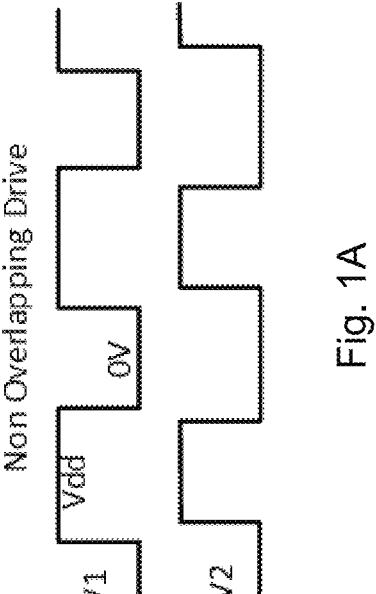
FIGS. 1*a* and 1*b* disclose examples of clock signals used in the cross-coupled latch charge pump in accordance with the present disclosure.
Figure 2:
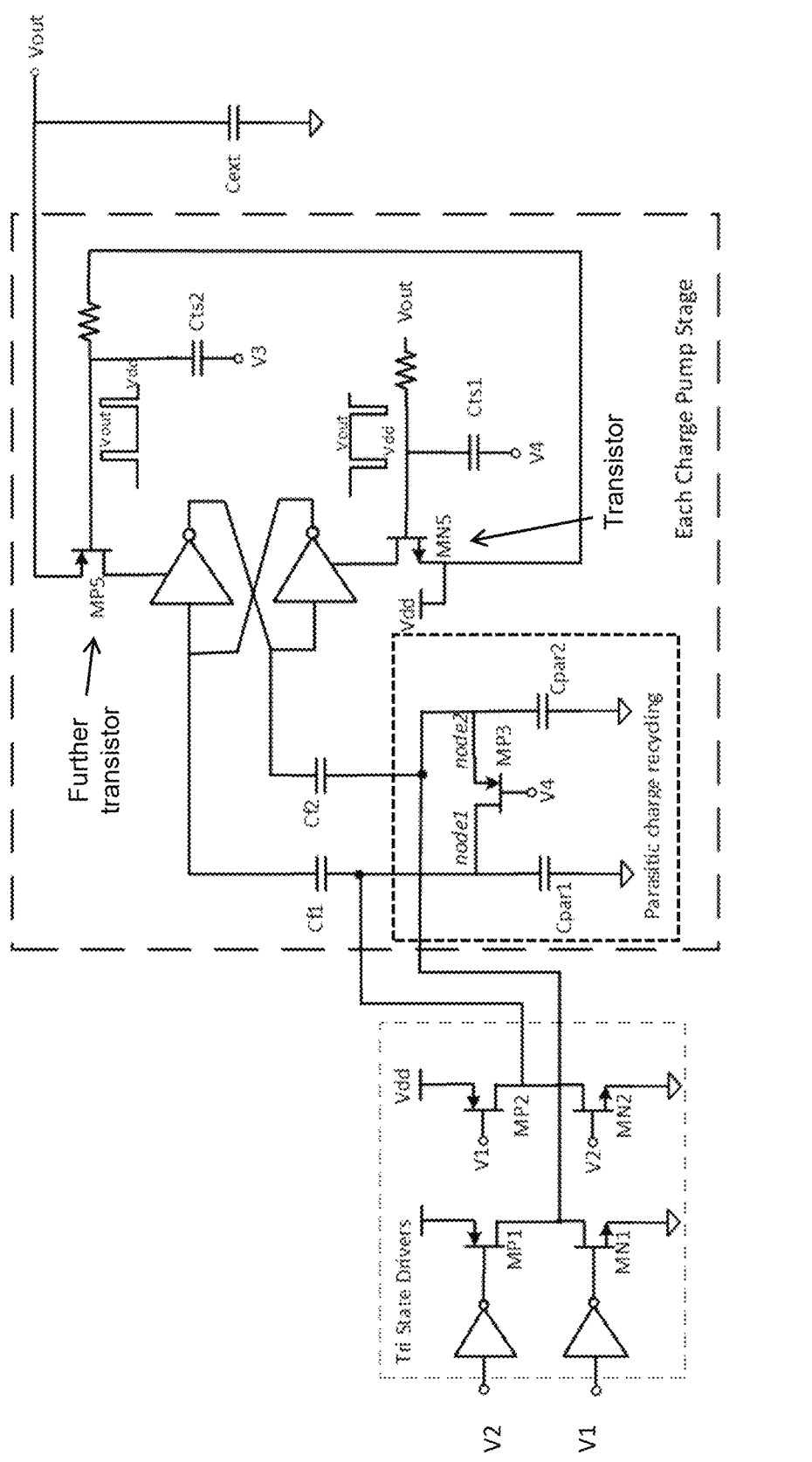
FIG. 2 discloses an example of a cross-coupled latch charge pump in accordance with the present disclosure.

FIG. 1*a* discloses an example of a non-overlapping drive for driving the cross-coupled latch charge pump in accordance with the present disclosure. The voltages V1 and V2 are also depicted in FIG. 2, for indicating where in the circuit these clocks are applied. V1 and V2 form the input to the non-overlapping driver comprised of MP1, NM1, MP2 and MN2. The input to the cross-coupled latches are the unlabeled outputs of the Tri State Driver.

Figure 1B:
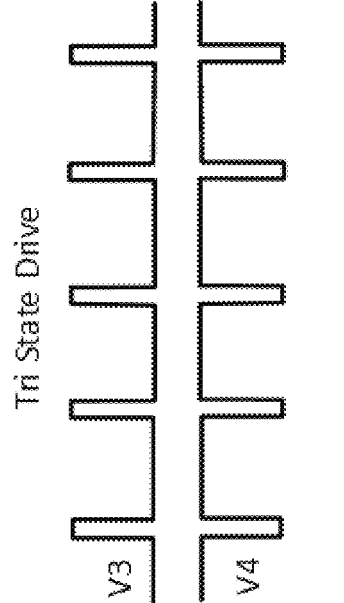

FIG. 1*b* discloses a so-called tri-state drives, i.e. voltages V3 and V4. The voltages V3 and V4 are also depicted in FIG. 2, for indicating where in the circuit these signals are applied. The signal V4 is applied to the shunt switch MP3, for ensuring that charge can be transferred between the parasitic capacitances Cpar1 and Cpar2. This is explained further in more detail. The signal V3 may be applied as a control signal towards the further transistor MP5. This is explained in more detail further as well.

Reference is now made to FIG. 1*c*. Here, node1 and node2 are indicated. These node1 and node2 are also indicated in FIG. 2, wherein node1 is located on the lower voltage plate of the first fly capacitor Cf1 and node2 is located on the lower voltage plate of Cf2. The shunt switch allows electric charge to be transferred between Cpar1 and Cpar2, i.e. between these nodes node1 and node2.

This is visualized in FIG. 1c, wherein the transfer of electrical energy between these nodes is driven by the control signal V4 that is provided to the gate terminal of the shunt switch.

Reference is now made to FIG. 2. The cross-coupled latch charge pump comprises a plurality of electronic components. A first fly capacitor Cf1 and a second fly capacitor Cf2 is provided. These fly capacitors are connected to a cross-coupled latch, i.e. as indicated with the two inverters.

The input to the fly capacitors Cf1 and Cf2 is provided using so-called "Tri State Drivers", i.e. comprising two inverters, and transistors MP1, MP2, MN1 and MN2.

The goal of this particular circuit, i.e. the tri state drivers, is to generate complementary clock signals which alternate between time periods of positive and negative output, with a brief period of time during the phase transitions when the driver outputs are in a high impedance ("floating") state.

The present disclosure focusses on the introduction of the transistor MN5. The transistor MN5 is controlled on its gate terminal and may include the RC network as depicted. The voltage V4 may control the state of the transistor, i.e. whether it is in a conducting state or not. This enables the corresponding inverter to be in a high impedance state, or not, thereby reducing the backwards current flow from the output, i.e. Cext, back to the input and allowing the fly capacitors Cf1 and Cf2 to temporarily float, thereby allowing charge to be recycled between Cpar1 and Cpar2.

The same reasoning as upheld above is valid for the further transistor MP5, as depicted on the top side of FIG. 2.

Figure 3:
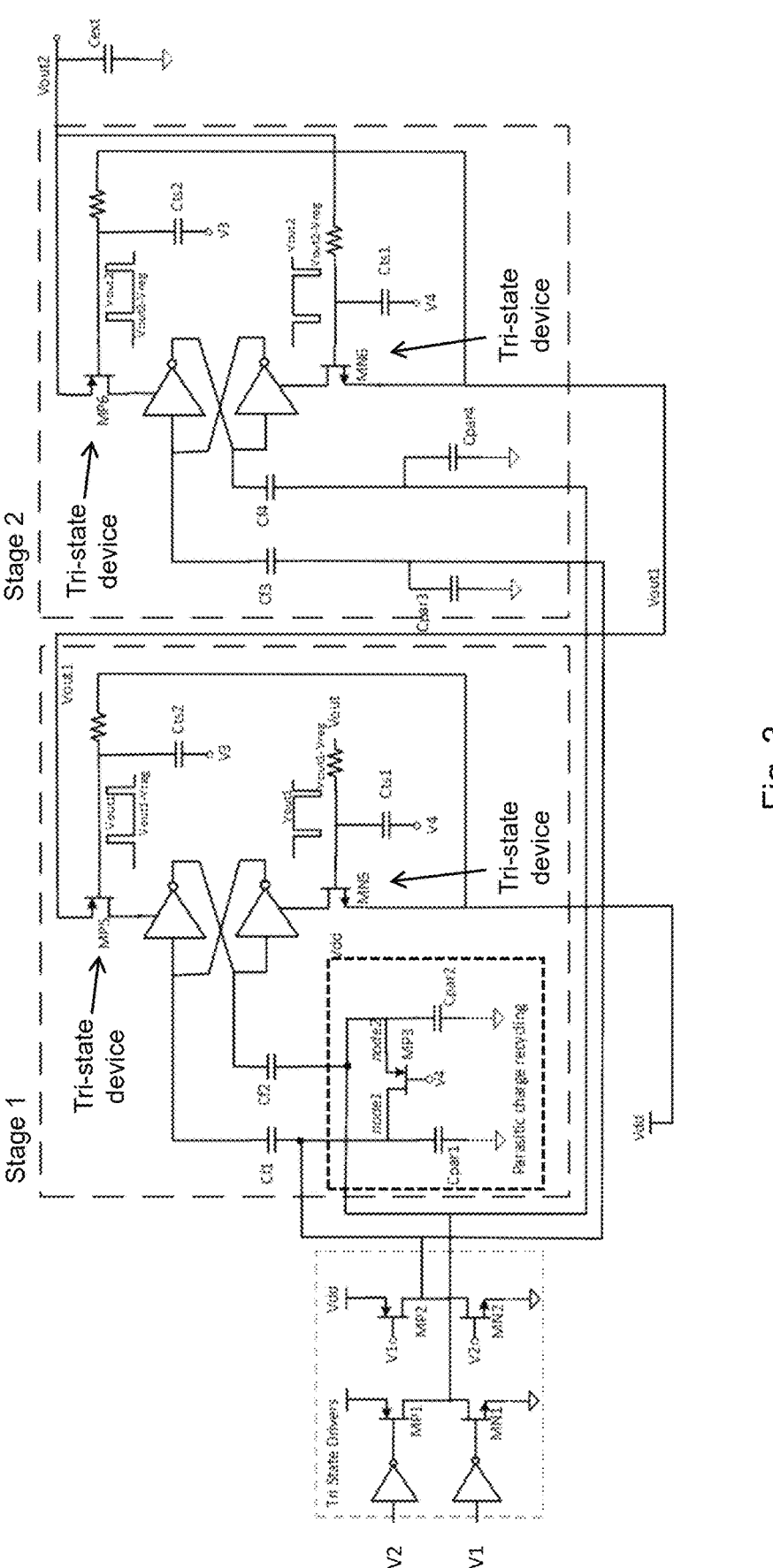
FIG. 3 discloses an example of two connected cross-coupled latch charge pumps in accordance with the present disclosure.

In FIG. 3, an extension of the present application is depicted. An additional stage is added, which may, or may not, include a separate tri-state driver circuit, as well as it may, or may not, include an additional shunt switch. Note that this circuit may be further connected to a third circuit or more.

Figure 4:
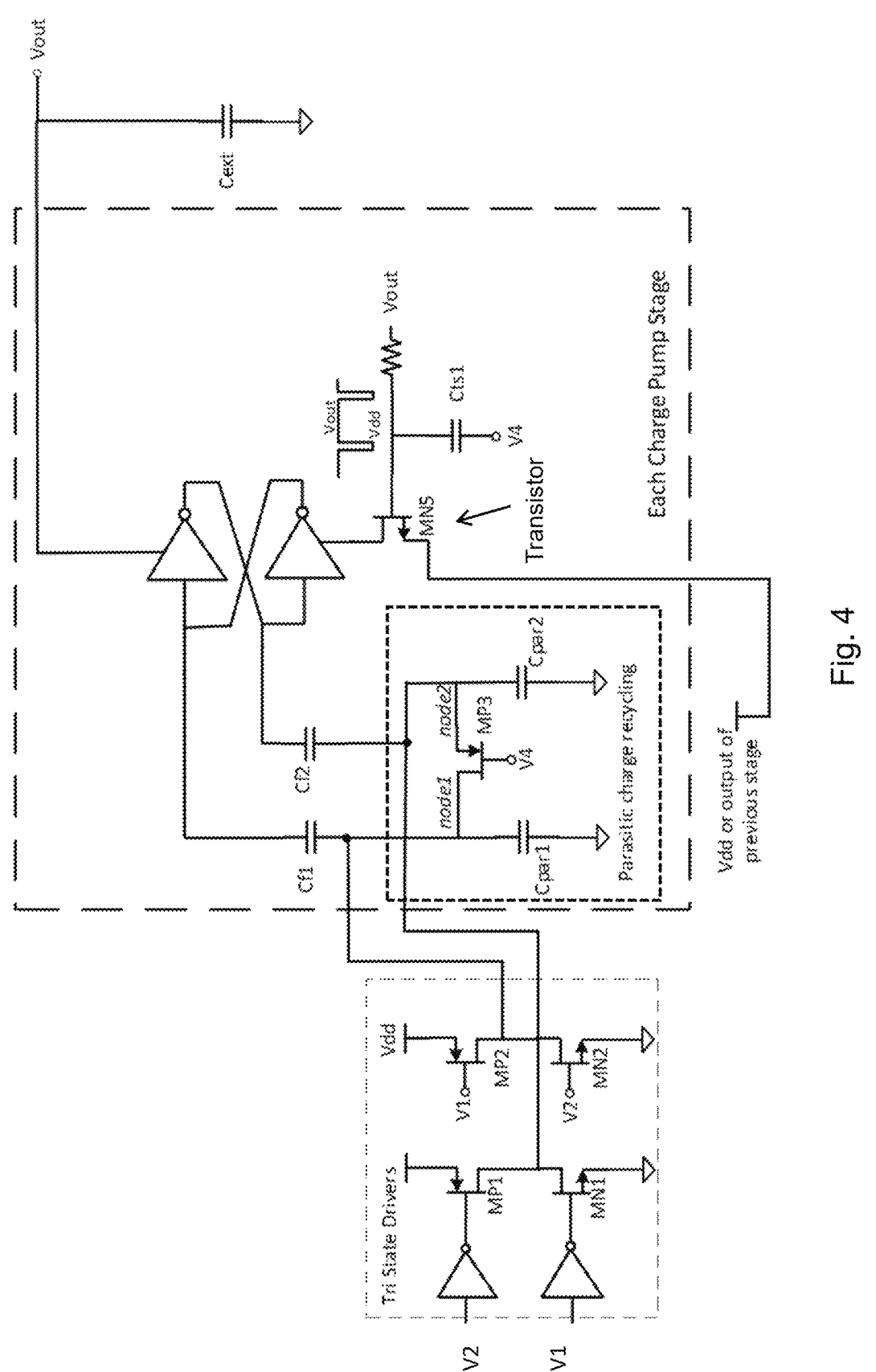
FIG. 4 discloses a basic example of a cross-coupled latch charge pump in accordance with the present disclosure.

In FIG. 4 a basic implementation of the present disclosure is depicted, wherein only one transistor is applied to the cross-coupled latch charge pump. This is a cost-effective way for mitigating the backward flow of current from the output to the input.

As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

The invention claimed is:

1. A cross-coupled latch charge pump, comprising:
a first inverter;
a second inverter, wherein the first inverter has an output that is connected to an input of the second inverter and the second inverter has an output that is connected to an input of the first inverter, and wherein both the first and second inverter have first supply terminals that are connected to an output capacitor and the first and second inverter have second supply terminals that are connected to a reference voltage;
a first fly capacitor comprising a first and a second plate;

wherein the first plate of the first fly capacitor is arranged to receive a first clock signal, and wherein the second plate of the first fly capacitor is connected to the input of the first inverter;
a second fly capacitor comprising a first and a second plate; wherein the first plate of the second fly capacitor is arranged to receive a second clock signal, and wherein the second plate of the second fly capacitor is connected to the input of the second inverter; and
wherein the cross-coupled latch charge pump comprises a transistor connected between the reference voltage and the second supply terminals and an output voltage over the output capacitor that is provided to a gate terminal of the transistor.

2. The cross-coupled latch charge pump in accordance with claim 1, wherein the cross-coupled latch charge pump further comprises a capacitance connected between the gate terminal of the transistor and a control signal, and further comprises an impedance connected between the gate terminal of the transistor and the output capacitor.

3. The cross-coupled latch charge pump in accordance with claim 2, wherein the cross-coupled latch charge pump further comprises a further transistor connected between the output capacitor and the first supply terminals.

4. The cross-coupled latch charge pump in accordance with claim 3, wherein the further transistor has a gate terminal is connected to control signal.

5. The cross-coupled latch charge pump in accordance with claim 4, wherein the cross-coupled latch charge pump further comprises a further capacitance connected between the gate terminal of the further transistor and a further control signal, and a further impedance connected between the gate terminal of the further transistor and the reference voltage.

6. The method of operating a cross-coupled latch charge pump in accordance with claim 3, wherein the method comprises the step of temporarily placing, by the transistor, the first and second inverter into a high impedance state by receiving the control signal on the gate terminal of the transistor.

7. The method in accordance with claim 6, further comprising the step of temporarily placing, by the further transistor, the first and second inverter into a high impedance state by receiving the further reference voltage on the gate terminal of the further transistor.

8. The method in accordance with claim 6, further comprising the step of:
allowing, by the shunt switch, charge to flow between parasitic capacitance connected to the first plate of the first fly capacitor and the first plate of the second fly capacitor; and
wherein the cross-coupled latch charge pump further comprises a shunt switch connected between the first plate of the first fly capacitor and the first plate of the second fly capacitor.

9. The method in accordance with claim 8, wherein further comprising the step of receiving, by the gate terminal of the shunt switch, the control signal.

10. The method in accordance with claim 9, wherein the shunt switch comprises a transistor.

11. The method in accordance with claim 8, wherein the shunt switch comprises a transistor.

12. The cross-coupled latch charge pump in accordance with claim 1, wherein the cross-coupled latch charge pump further comprises a shunt switch connected between the first plate of the first fly capacitor and the first plate of the second fly capacitor.

13. The cross-coupled latch charge pump in accordance with claim 12, wherein the shunt switch has a gate terminal that is connected to the further control signal.

14. The cross-coupled latch charge pump in accordance with claim 1, wherein the cross-coupled latch charge pump further comprises a non-overlapping drive clock arranged to provide non-overlapping drive signals to the first plate of the first fly capacitor and to the first plate of the second fly capacitor, respectively.

15. The cross-coupled latch charge pump in accordance with claim 1, wherein the latch charge pump further comprises a tri-state drive clock arranged for providing inverse drive signals, and wherein the drive signals have a first signal that is the control signal and a second of the drive signals is the further control signal.

16. A cross-coupled latch charge pump, comprising:

a first inverter;

a second inverter, wherein the first inverter has an output that is connected to an input of the second inverter and the second inverter has an output that is connected to an input of the first inverter, and wherein both the first and second inverters have first supply terminals that are connected to an output capacitor and the first and second inverters have second supply terminals that are connected to a reference voltage;

a first fly capacitor comprising a first plate and a second plate; wherein the first plate of the first fly capacitor is arranged to receive a first clock signal, and wherein the second plate of the first fly capacitor is connected to the input of the first inverter;

a second fly capacitor comprising a first and a second plate; wherein the first plate of the second fly capacitor is arranged to receive a second clock signal, and wherein the second plate of the second fly capacitor is connected to the input of the second inverter; and wherein the cross-coupled latch charge pump comprises a transistor connected between the reference voltage and the second supply terminals and a shunt switch connected between the first plate of the first fly capacitor and the first plate of the second fly capacitor.

17. The cross-coupled latch charge pump in accordance with claim 16, wherein the shunt switch has a gate terminal that is connected to the further control signal.

*    *    *    *    *